US010872661B2

(12) United States Patent
Xue et al.

(10) Patent No.: US 10,872,661 B2
(45) Date of Patent: Dec. 22, 2020

(54) RERAM PROGRAMMING METHOD INCLUDING LOW-CURRENT PRE-PROGRAMMING FOR PROGRAM TIME REDUCTION

(71) Applicant: Microchip Technology Inc., Chandler, AZ (US)

(72) Inventors: Fengliang Xue, San Jose, CA (US); Fethi Dhaoui, Mountain House, CA (US); Victor Nguyen, San Ramon, CA (US); John L. McCollum, Orem, UT (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/405,936

(22) Filed: May 7, 2019

(65) Prior Publication Data

US 2020/0327938 A1 Oct. 15, 2020

Related U.S. Application Data

(60) Provisional application No. 62/832,220, filed on Apr. 10, 2019.

(51) Int. Cl.
*G11C 13/00* (2006.01)
(52) U.S. Cl.
CPC ........ *G11C 13/0069* (2013.01); *G11C 13/004* (2013.01); *G11C 13/0026* (2013.01); *G11C 13/0028* (2013.01); *G11C 13/0061* (2013.01); *G11C 13/0097* (2013.01); *G11C 2013/0078* (2013.01)

(58) Field of Classification Search
CPC ............ G11C 13/0069; G11C 13/0026; G11C 13/0028; G11C 13/004; G11C 13/0061; G11C 13/0097; G11C 13/0078
USPC ....................................................... 365/148
See application file for complete search history.

(56) References Cited

U.S. PATENT DOCUMENTS

| 9,583,196 | B2* | 2/2017 | Navon | G11C 16/3486 |
|---|---|---|---|---|
| 10,468,107 | B2* | 11/2019 | Wong | G11C 16/3454 |
| 2009/0010039 | A1* | 1/2009 | Tokiwa | G11C 13/0007 365/148 |
| 2010/0165711 | A1* | 7/2010 | Lee | G11C 13/0004 365/163 |
| 2016/0365144 | A1 | 12/2016 | Ueki et al. | |
| 2020/0005866 | A1* | 1/2020 | Jain | G11C 13/004 |

(Continued)

OTHER PUBLICATIONS

PCT/US2019/043124, International Search Report and Written Opinion of the International Searching Authority, dated Dec. 17, 2019.

*Primary Examiner* — Fernando Hidalgo
(74) *Attorney, Agent, or Firm* — Glass and Associates; Kenneth Glass; Kenneth D'Alessandro (57) ABSTRACT

A method for programming a resistive random-access memory (ReRAM) cell includes passing a first current through the ReRAM device for a first period of time, the first current selected to create a leakage path through the ReRAM device, and after passing the first current through the ReRAM device passing a second current through the ReRAM device for a second period of time shorter than the first period of time, the second current selected to create a current path having a desired resistance through the leakage path through the ReRAM device.

23 Claims, 8 Drawing Sheets

(56) References Cited

U.S. PATENT DOCUMENTS

| | | | |
|---|---|---|---|
| 2020/0005867 A1* | 1/2020 | Sassine | G11C 13/0097 |
| 2020/0066351 A1* | 2/2020 | Wong | G11C 11/5642 |

* cited by examiner

Bit Line (18) Voltage = +Vpgm
Source Line (20) Voltage = 0V

FIG. 8A

Bit Line (18) Voltage = 0V
Source Line (20) Voltage = +Verase

RERAM PROGRAMMING METHOD INCLUDING LOW-CURRENT PRE-PROGRAMMING FOR PROGRAM TIME REDUCTION

BACKGROUND

Resistive random-access memory (ReRAM) memory cells are formed using ReRAM devices. A ReRAM device includes two conductive electrodes, one of which serves as an ion source, separated by layer of a solid electrolyte. To program the ReRAM device a programming potential is applied across the two electrodes having a polarity and magnitude that causes ions from the ion source electrode to migrate into the solid electrolyte layer and form a conductive path between the two electrodes. The ReRAM device is erased by applying an erase potential across the two electrodes having a polarity opposite to that of the programming potential and a magnitude that causes ions to migrate from the solid electrolyte layer back to the ion source electrode to eliminate the conductive path between the two electrodes.

Figure 1:
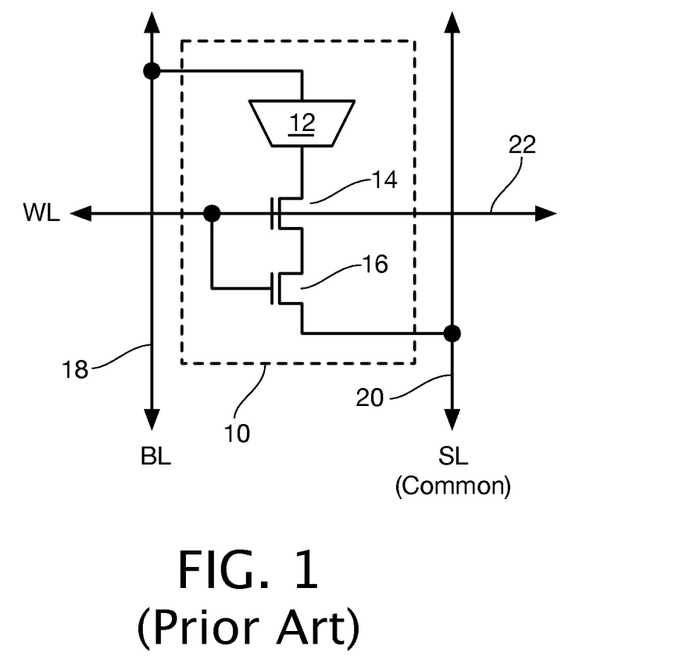
FIG. 1 is a simplified schematic diagram of a representative ReRAM memory cell.

Referring now to FIG. 1, a schematic diagram shows a representative ReRAM cell 10. The ReRAM memory cell 10 includes a ReRAM device 12 connected in series with first and second series-connected select transistors 14 and 16. The memory cell 10 is coupled between a bit line (BL) 18 to which one terminal of the ReRAM device 12 is connected and a source line (SL) 20 to which the source of the select transistor 16 is connected. In certain embodiments the source line 20 may be common to multiple memory cells 10. The gates of both select transistors 14 and 16 are connected together to a word line 22. In an array of such memory cells 10, the bit line 18 and the source line 20 typically run in a column direction of the array while the word line 22 typically runs in a row direction of the array. Persons of ordinary skill in the art will appreciate that some ReRAM memory cells employ only a single select transistor instead of first and second series-connected select transistors 14 and 16.

Figure 2:
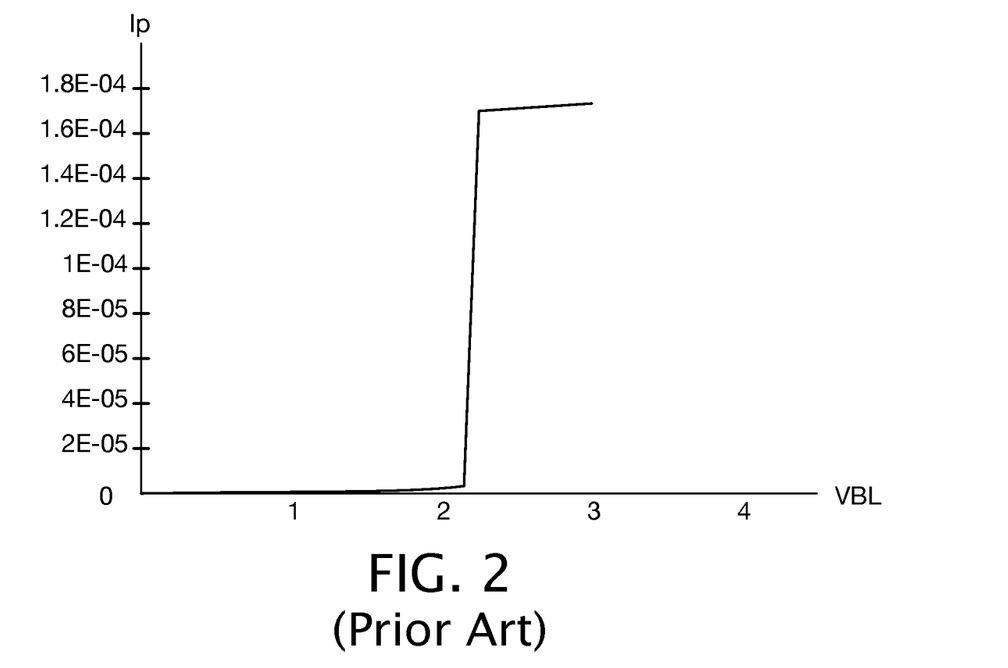
FIG. 2 is a graph showing a representative prior-art ReRAM programming IV curve.

Referring now to FIG. 2, a graph shows a typical prior-art ReRAM programming IV curve showing a simplified representation of a ReRAM programming event. The programming voltage is applied between the bit line 18 and the source line 20 and is represented in FIG. 2 by VBL on the x-axis. The y-axis shows the programming current. As can be seen from FIG. 2, the current gradually rises as the VBL voltage approaches 2V and then quickly rises to a stable level determined by the gate drive voltage applied to the select transistor 14 via word line 22.

Figure 3:
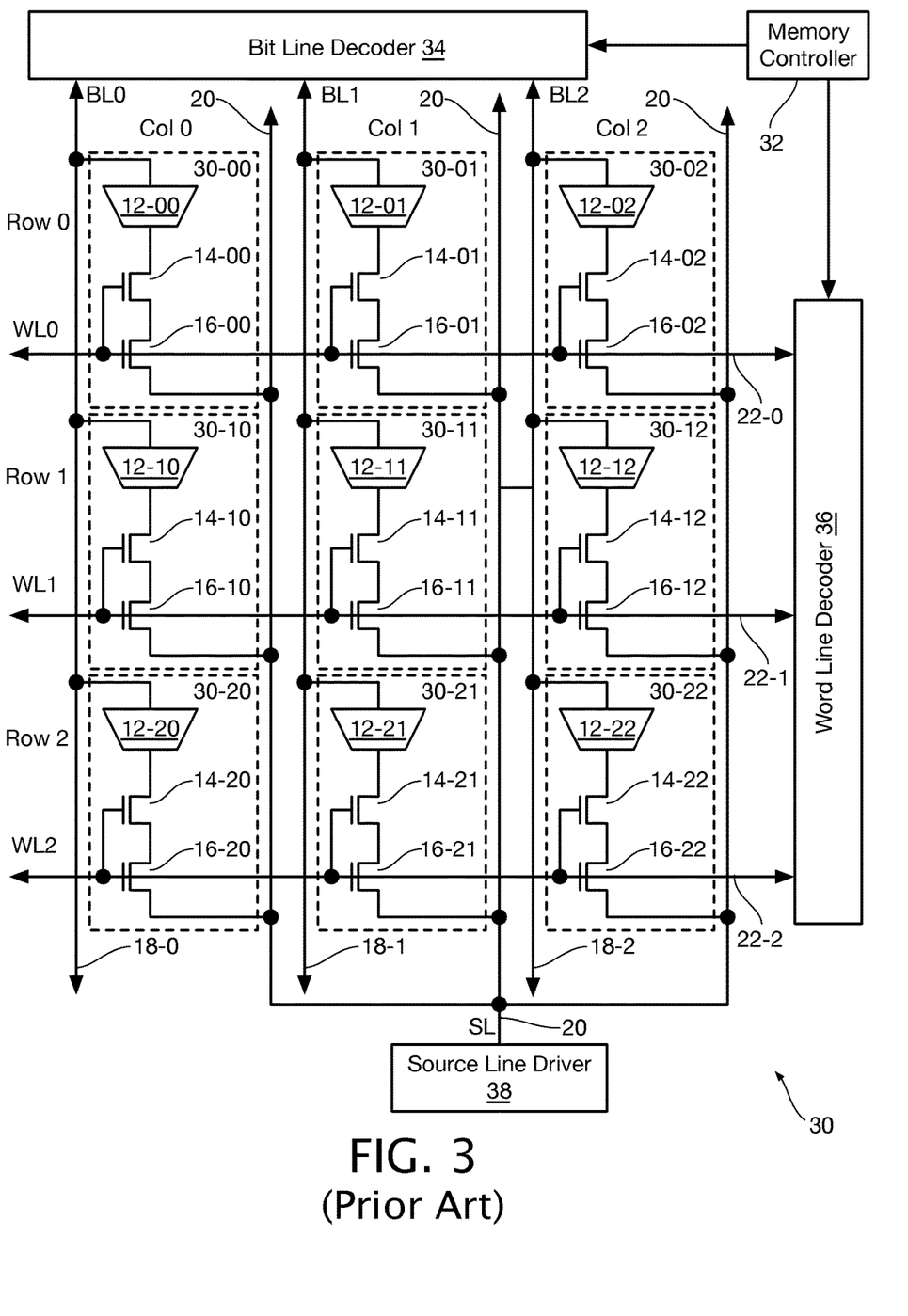
FIG. 3 is a schematic diagram of a representative prior-art array of ReRAM memory cells.

Referring now to FIG. 3, a schematic diagram shows a representative prior-art array 30 of ReRAM memory cells. The array 30 is shown having three rows and three columns for purposes of illustration. Persons of ordinary skill in the array will appreciate that arrays of arbitrary sizes are within the scope of the present invention.

The first row of the array 30 includes ReRAM memory cells 30-00, 30-01, and 30-02 shown inside dashed lines. The second row of the array 30 includes ReRAM memory cells 30-10, 30-11, and 30-12 shown inside dashed lines. The third row of the array 30 includes ReRAM memory cells 30-20, 30-21, and 30-22 shown inside dashed lines. The first column of the array 30 includes ReRAM memory cells 30-00, 30-10, and 30-20. The second column of the array 30 includes ReRAM memory cells 30-01, 30-11, and 30-21. The third column of the array 30 includes ReRAM memory cells 30-02, 30-12, and 30-22.

ReRAM memory cells 30-00, 30-10, and 30-20 in the first column of the array are connected between bit line (BL) 18-0 and a common source line (SL) 20 for the array. ReRAM memory cells 30-01, 30-11, and 30-21 in the second column of the array are connected between bit line (BL) 18-1 and the common source line (SL) 20. ReRAM memory cells 30-02, 30-12, and 30-22 in the third column of the array are connected between bit line (BL) 18-2 and the common source line (SL) 20.

The gates of select transistors 14-00, 14-01, 14-02, 16-00, 16-01, and 16-02 in ReRAM memory cells 30-00, 30-01, and 30-02, respectively, in the first row of the array are connected to word line (WL0) 22-0. The gates of select transistors 14-10, 14-11, 14-12, 16-10, 16-11, and 16-12 in ReRAM memory cells 30-10, 30-11, and 30-12, respectively, in the second row of the array are connected to word line (WL1) 22-1. The gates of the select transistors 14-20, 14-21, 14-22, 16-20, 16-21, and 16-22 in ReRAM memory cells 30-20, 30-21, and 30-22, respectively, in the third row of the array are connected to word line (WL2) 22-2.

The operation of the memory array 30 is directed by a memory controller 32 that provides addresses to a bit line decoder 34 used to drive and sense the bit lines 18-0, 18-1, and 18-2. A word line decoder 36 directed by the memory controller 32 drives the word lines 22-0, 22-1, and 22-2 to the voltages necessary to enable the operations of the memory cells in the array in the various modes of operation. A source line driver 38 directed by the memory controller 32 (connection not shown) controls the voltage at the common source line 20, which is typically connected to ground during programming and read operations and to an erase potential during erase operations. The circuitry internal to the memory controller 32, the bit line controller 34, the word line controller 36 and the source line driver 38 are easily configured by persons of ordinary skill in the art having knowledge of memory array control circuits and the various potentials that need to be applied to the memory cells during the various modes of operation set forth herein.

Figure 4:
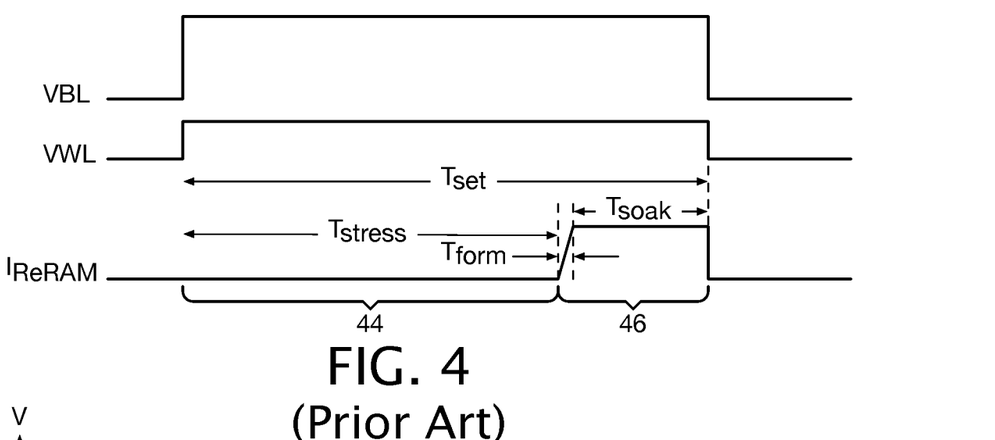
FIG. 4 is a graph of voltage vs. time showing a simplified representation of a ReRAM programming event.

To better understand the variation of program time for a ReRAM cell, a ReRAM program pulse may be considered to involve three periods as shown in FIG. 4, which shows a ReRAM cell current, denoted $I_{ReRAM}$ during programming in parallel with a word line voltage VWL and a bit line voltage VBL both utilized for programming. The first time period $T_{stress}$, at reference numeral 44, is a stress time period during which the dielectric is stressed until it fails. $T_{stress}$ begins upon application of the programming voltages VWL and VBL and ends at the beginning of the time period $T_{form}$ when the programming current starts rapidly increasing. The second time period $T_{form}$, immediately following $T_{stress}$, is the time during which the conducting metal filament is formed in the solid electrolyte layer, and ends at the beginning of time $T_{soak}$ at reference numeral 46 when the voltage across the ReRAM device has collapsed to its minimum value, and the ReRAM cell current $I_{ReRAM}$ shown in FIG. 4 has reached its maximum value. The third time period $T_{soak}$, immediately following $T_{form}$, is the soak time during which the filament is stabilized. $T_{form}$ is very short, and is usually under 100 nSec; $T_{soak}$ is relatively short, and is usually 2 µSec or less. It has been found that the varying programming time exhibited by ReRAM memory cells is due to $T_{stress}$. This time period can vary from cell to cell and from cycle to cycle for the same cell, and can range from under 1 µSec to over 1000 µSec. The combination of $T_{form}$ and $T_{soak}$ is shown at reference numeral 46.

The particular value of VBL shown in FIG. 4 is just above 2V. Initially, very little current flows during the time $T_{stress}$.

As the conductive path begins to form in the solid electrolyte layer of the ReRAM device the current through the ReRAM device rapidly increases (shown in FIG. 3 as the time interval $T_{form}$). The increase of the ReRAM device current then slows down and begins to level out during the time interval $T_{soak}$ as the select transistors move into to saturation. This variation in ReRAM device current during the time $T_{soak}$ is so slight as to not be discernible using the y-axis scale of the $I_{ReRAM}$ current shown in FIG. 4. At this point the select transistors 14, 16 are in saturation and the maximum current flowing through the ReRAM device is determined by the select transistors 14 and 16 that are controlled by the voltage VWL on the word line provided by word line decoder 36. The total number of ReRAM cells that can be simultaneously programmed is limited by the total current $I_{ReRAM}$ that can safely be drawn within the integrated circuit containing the ReRAM memory cell array being programmed.

Figure 5:
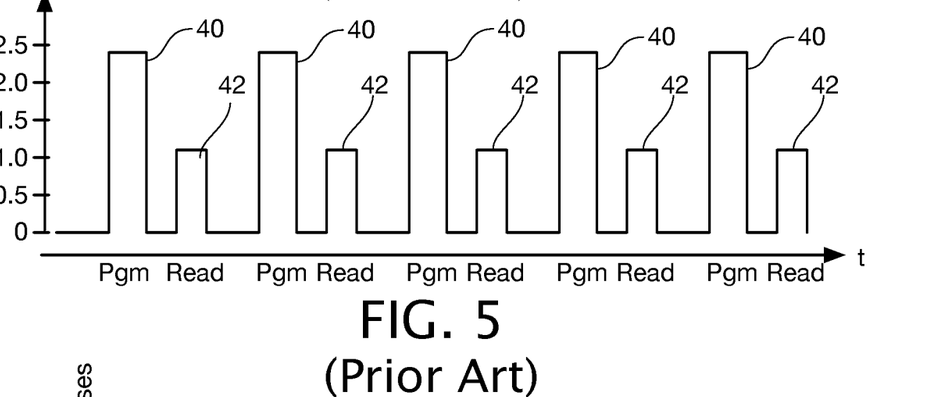
FIG. 5 is a graph of voltage vs. time showing a typical multi-pulse ReRAM programming potential interleaved with read pulses.

Many ReRAM device programming procedures involve applying a series of programming pulses, between which the resistance of the ReRAM device is read by applying read pulses each having a magnitude less than the programming pulses. The programming sequence is terminated once the resistance of the ReRAM device has reached an acceptable level. FIG. 5 is a graph of VBL voltage vs. time showing a typical multi-pulse ReRAM programming potential (reference numeral 40) interleaved with read pulses (reference numeral 42) according to such a programming procedure.

Figure 6:
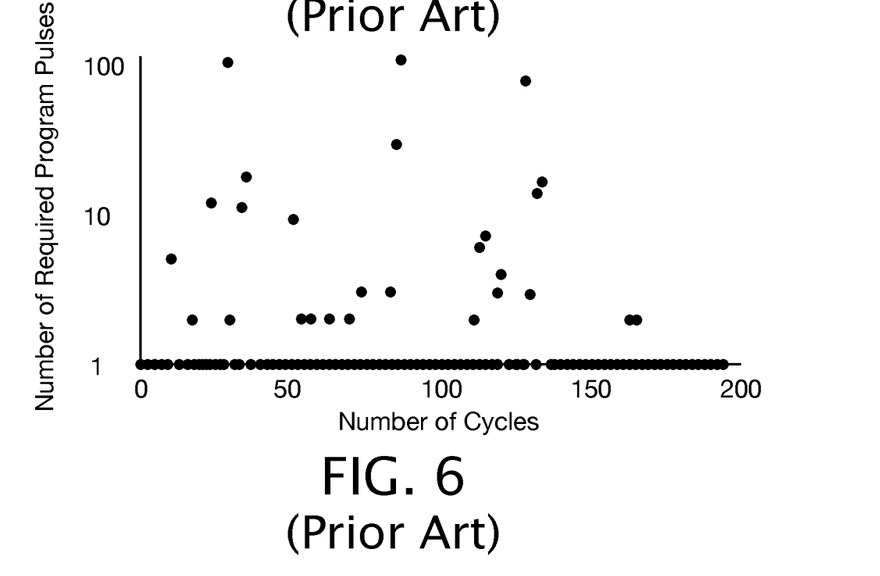
FIG. 6 is a graph showing a distribution of the number of programming pulses needed as a function of the number of programming cycles using the programming pulse sequence of FIG. 5.

It has been observed that the time needed to program a ReRAM memory cell, using the same programming voltage, can be as fast as less than 1 μs, or as slow as greater than 1 ms. FIG. 6 is a graph illustrating the number of programming pulses needed to program ReRAM devices (y-axis) as a function of the number of program/erase cycles experienced by the ReRAM memory cell. The same ReRAM memory cell can behave as a normal-time-to-program bit or a fast-to-program bit during one programming cycle, and a slow-to-program bit during another programming cycle.

It has been posited that a few slow-to-program ReRAM memory cells may not be an issue because they do not significantly add to the programming time budget for a large array of ReRAM memory cells that are being programmed one at a time. The total programming time for the entire ReRAM array in an integrated circuit chip having a few slow-to-program ReRAM memory cells may still be acceptable.

However, at the array level, multiple ReRAM memory cells are programmed in parallel to increase program speed. The number of ReRAM memory cells that are programmed in parallel can be 8, 16, 32, 64 or greater, depending on the programming architecture and power budget. When programming multiple ReRAM memory cells in parallel, programming time for each parallel group is limited by the slowest-to-program memory cells, which are likely to be distributed among different ones of the groups. Using a prior-art programming scheme such as the one depicted in FIG. 4, the programming time alone, without counting verify and erase time, can be longer than 200 seconds to program a 1G bit ReRAM based FPGA array. This time is unreasonably long and is longer than provided by many product specifications (under 20 seconds for example). In addition, the number of ReRAM memory cells that can be simultaneously programmed is limited by the total available programming current budget for the integrated circuit containing the memory array.

In addition, as previously noted with reference to FIGS. 5 and 6, multiple high current pulses are required in the previous solutions which greatly increase programming time due to the aforementioned programming current budget.

BRIEF DESCRIPTION

The present invention includes methods to program ReRAM memory cells that reduce whole-chip programming times.

According to an aspect of the invention, a method for programming a resistive random-access memory (ReRAM) cell including a ReRAM memory device, includes generating a pre-programming pulse for a first period of time that passes a first current through the ReRAM device for the first period of time, the first current limited to a first magnitude selected to create a leakage path through the ReRAM device, after the first period of time has terminated, generating a programming pulse that passes a second current limited to a second magnitude greater than the first magnitude through the ReRAM device for a second period of time shorter than the first period of time, the second current selected to create a current path through the ReRAM device.

According to an aspect of the invention, the resistance of the ReRAM device is determined after passing the second current through the ReRAM device for the second period. Passing the second current through the ReRAM device is repeated only if the resistance of the ReRAM device is higher than a predetermined value.

According to an aspect of the invention, the first period of time is in the range of from about 10 μSec to about 1 mSec and the second period of time is in the range of from about 1 μSec to about 10 μSec.

According to an aspect of the invention, the first period of time is about 100 μSec and the second period of time is about 1 μSec.

According to an aspect of the invention, the first current is between about 1 μA and about 100 μA.

According to an aspect of the invention, the second current is between about 100 μA and about 1 mA.

According to an aspect of the invention, a method for programming a resistive random-access memory (ReRAM) cell including a ReRAM device and at least one select transistor connected in series between a bit line and a source line, the at least one select transistor having a gate connected to a word line, includes applying a programming potential between the bit line and the source line, applying a first voltage pulse to the word line, the first voltage turning on the at least one select transistor to cause a first current limited to a first magnitude to flow through the ReRAM device, the first magnitude selected to create a leakage path through the solid electrolyte layer, applying a second voltage pulse to the word line after applying the first voltage to the word line, the second voltage having a magnitude higher than the first voltage, the second voltage turning on the at least one select transistor to cause a second current limited to a second magnitude higher than the first magnitude to flow through the ReRAM device, the second current selected to create a current path having a desired resistance across the ReRAM cell through the leakage path through the solid electrolyte layer. The first voltage pulse has a width larger than the second voltage pulse.

According to an aspect of the invention, the resistance of the ReRAM cell is determined after the end of the second voltage pulse. If the determined resistance of the ReRAM cell is higher than the desired resistance an additional second voltage pulse is applied to the word line and the resistance is again determined. If the determined resistance of the ReRAM cell is no higher than the desired resistance the method is terminated.

According to an aspect of the invention, a method for programming a selected ReRAM memory cell in an array of ReRAM memory cells includes selecting at least one ReRAM memory cell, passing a first current through the ReRAM device in the at least one selected ReRAM memory cell for a first period of time, the first current limited to a first magnitude selected to create a leakage path through the ReRAM device, after passing the first current through the ReRAM device in the at least one selected ReRAM memory cell passing a second current through the ReRAM device in the at least one selected ReRAM memory cell for a second period of time shorter than the first period of time, the second current limited to a second magnitude greater than the first magnitude.

According to an aspect of the invention, selecting at least one ReRAM memory cell includes applying a programming potential between a bit line connected to the at least one ReRAM memory cell and a source line connected to the at least one ReRAM memory cell.

According to an aspect of the invention, passing a first current through the ReRAM device in the at least one selected ReRAM memory cell for a first period of time includes turning on at least one select transistor connected in series with the ReRAM device by applying a first gate potential to the select transistor, the applied first gate potential limiting the first current to the first magnitude, and passing a second current through the ReRAM device in the at least one selected ReRAM memory cell for a second period of time shorter than the first period of time includes turning on the at least one select transistor connected in series with the ReRAM device by applying a second gate potential to the select transistor, the second gate potential being greater than the first gate potential.

According to an aspect of the invention, an array contains rows and columns of ReRAM memory cells. Each column of memory cells including ReRAM memory cells formed from a ReRAM device in series with at least one select transistor between a column bit line and a column source line. Each row of memory cells includes a word line coupled to the gate of the at least one select transistor. A programming circuit includes a bit line decoder coupled to each of the bit lines in the array, a word line decoder coupled to each of the word lines in the array, a source line driver coupled to common source line in the array, a memory controller coupled to the bit line decoder, the word line decoder, and the source line driver, the memory controller configured to address ReRAM cells in the array and to program selected ReRAM cells in the array by controlling the bit line decoder, the word line decoder and the source line driver to pass a first current through the ReRAM device for a first period of time, the first current limited to a magnitude selected to create a leakage path through the selected ReRAM devices and after passing the first current through the ReRAM device pass a second current through the selected ReRAM devices for a second period of time shorter than the first period of time, the second current limited to a magnitude selected to create a current path through the ReRAM device.

According to an aspect of the invention, the programming circuit is further configured to erase selected ReRAM cells in the array by controlling the bit line decoder, the word line decoder and the source line driver to pass an erase current in a direction opposite the first and second currents through the selected ReRAM devices, the erase current limited to a magnitude selected to remove the current path through the ReRAM device.

According to an aspect of the invention, the memory controller is further configured to control the common source driver to apply ground potential to the common source line during programming and reading and to apply an erase potential to the common source line during erasing.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

The programming methods of the present invention may be practiced on memory cells like the memory cell 10 depicted in FIG. 1 and arrays of memory cells like the array 30 depicted in FIG. 3. Persons of ordinary skill in the art will appreciate that the principles of the present invention apply to cells and array architectures other than the ones depicted in FIG. 1 and FIG. 3.

In FIG. 4, it can be seen that within one program (set) pulse, there are two different programming stages, a low current stage, during time period $T_{stress}$, indicated at reference numeral 44, during which a leakage path (a path formed from a series of one or more discontinuities in the solid electrolyte material that will define the location of the conductive path in the form of a filament) forms, and a high current stage, during time periods $T_{form}$ and $T_{soak}$, indicated at reference numeral 46, where the current path in the form of a continuous filament of metal ions from the ion source forms and is then stabilized. The methods of the present invention take advantage of this characteristic. In accordance with the present invention, a ReRAM cell programming process is divided into two controlled stages. During a first stage, referred to herein as a pre-program stage, a low-current-limited programming voltage pulse is provided, and during a second separate stage following the first stage, a high-current-limited programming voltage pulse is provided.

Figure 7A:
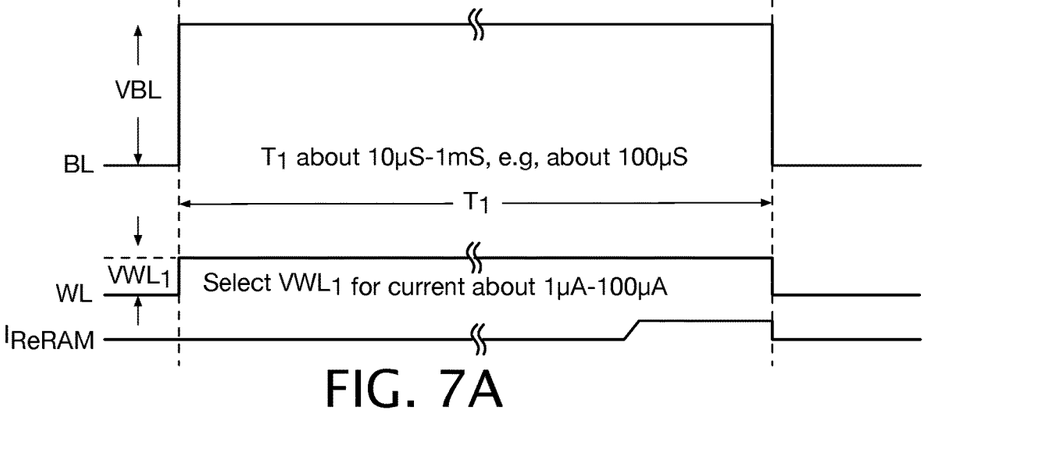
FIG. 7A is a graph of voltage vs. time showing the first step of an illustrative two-step ReRAM programming process in accordance with an aspect of the present invention.
Figure 7B:
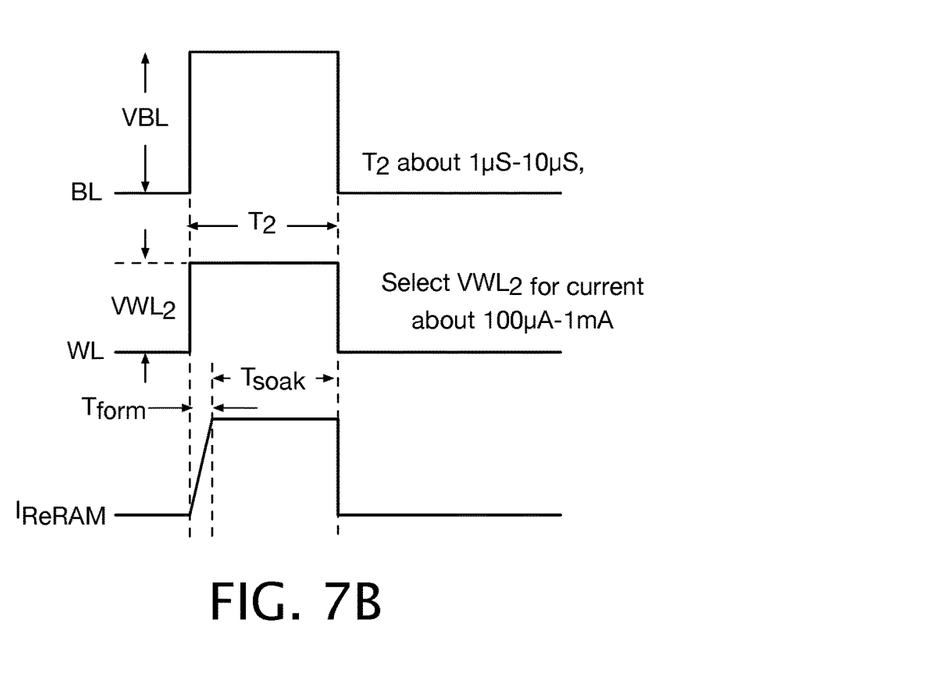
FIG. 7B is a graph of voltage vs. time showing the second step of an illustrative two-step ReRAM programming process in accordance with an aspect of the present invention.

The current level during the two programming stages is limited by the voltage used to drive the gate(s) of the access transistor(s) of the ReRAM cell. In the ReRAM memory cell of FIG. 1, two transistors 14 and 16 are used. The first stage, shown in FIG. 7A, may be referred to herein as a pre-program stage and the separate second stage, shown in FIG. 7B may be referred to herein as a program stage. The pre-program stage passes a first current through the ReRAM device for a first period of time. The first current is current limited to a magnitude selected to create a leakage path through the ReRAM device and can be performed using a single pulse having a pulse width T1, which should be long enough to pre-program the slowest bits. It has been found that a pre-program pulse in the 100 to about 1 mS range, e.g., about 100 µs in one embodiment, can be satisfactory for this purpose. The voltage VWL1 presented on the word line (WL) 22 to the gate(s) of the select transistors (e.g, 14 and 16) is selected to limit the first current, i.e. the pre-programming current to between about 1 µA to about 100 µA to flow through the ReRAM device. The particular value chosen in any instance will depend on the geometry and materials used to fabricate the ReRAM device.

The second stage may similar to that employed in the prior art as seen at the right side of FIG. 4, which can employ multiple pulses (FIG. 5) having pulse widths T2, with verify read pulses following each programming pulse as illustrated in FIG. 5 by program pulses 40 and read verify pulses 42. The voltage VWL2 presented on the word line (WL) 22 to the gate(s) of the select transistors (e.g, 14 and 16) is selected to limit a programming current to between about 100 µA to about 1 mA to flow through the ReRAM device. The particular value chosen in any instance will depend on the geometry and materials used to fabricate the ReRAM device. The current through the ReRAM device increases rapidly during the time period $T_{form}$ and then is relatively constant (limited by the select transistors 34 and 36 responsive to VWL2) during the time period $T_{soak}$ when the current path of the filament is being stabilized. The second stage is distinguished from the prior art programming in that in most cases the period $T_{stress}$ has already been accounted for in the pre-programming stage. The current limit is selected so as to program the cells to have a resistance less than a predetermined threshold, it being understood that not all device will necessarily be successfully programmed.

Figure 8A:
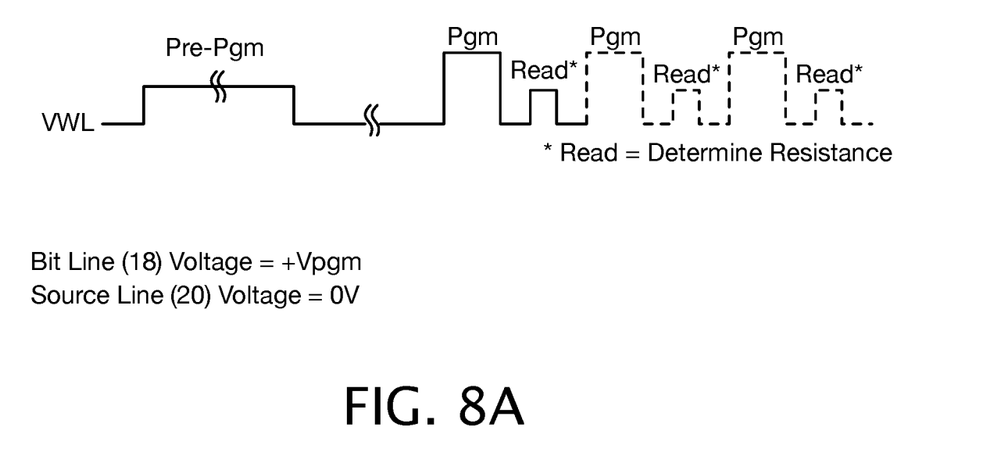
FIG. 8A is a graph of voltage vs. time showing representative word line, bit line, and source line potentials applied during an illustrative program, read and verify portion of a two-step ReRAM programming process in accordance with an aspect of the present invention.

FIG. 8A shows the bit line (VBL), word line (VWL), and source line (SL) voltages applied for a two-stage programming cycle in accordance with the present invention. A read cycle is performed after the programming pulse to measure the resistance of the programmed ReRAM cell, or compare the resistance of the programmed ReRAM cell with a predetermined threshold. In general, we will use the term determine the resistance to indicate that either the resistance is measured, or the resistance is compared with a predetermined threshold. The dashed lines indicate additional program and read resistance-determining pulses that may be necessary if the ReRAM resistance does not decrease to an acceptable level after the first programming pulse has been applied.

The pre-program and program periods may have different granularities in that the number of cells simultaneously subjected to the pre-programming pulses may be larger than the number of cells simultaneously subjected to the programming pulses due to the much lower currents drawn by each cell during the pre-programming period. The cells subject to simultaneous programming in each programming group are thus a subset of the cells subject to simultaneous pre-programming. This feature of the present invention allows significant programming time reduction at the array level.

Due to the much higher current drawn during the programming stage, the number of ReRAM memory cells programmed during the program stage is less than the number of ReRAM memory cells pre-programmed during the pre-program stage. The pulse width of the program pulses can be 1 µs, 2 µs or even longer, based on array characterization optimization results.

Figure 8B:
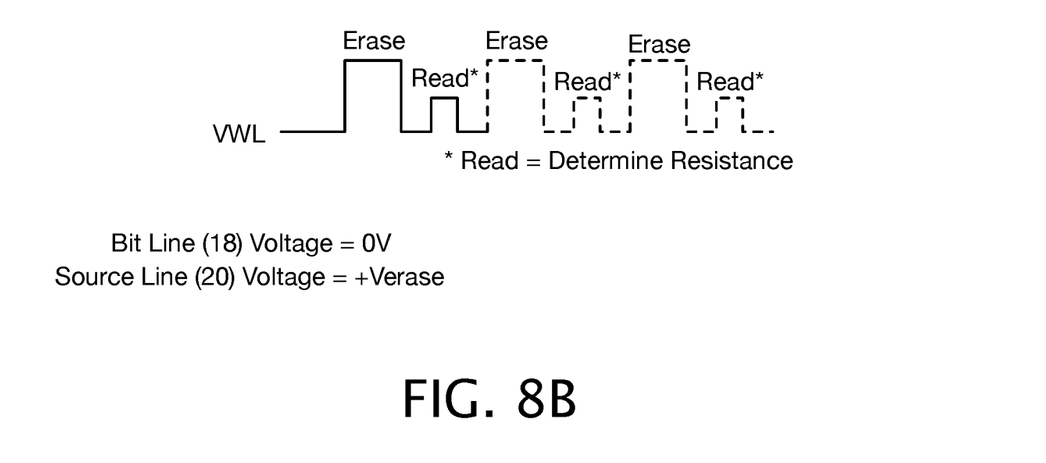
FIG. 8B is a graph of voltage vs. time showing representative word line, bit line, and source line potentials applied during an illustrative erase, read and verify portion of a two-step ReRAM programming process in accordance with an aspect of the present invention.

Referring now to FIG. 8B, a graph of voltage vs. time shows representative word line, bit line, and source line potentials applied during an illustrative erase, read and verify erase process in accordance with an aspect of the present invention. As will be appreciated by persons of ordinary skill in the art from a comparison of FIGS. 8A and 8B, the polarities of the applied bit line and source line voltages are reversed during the erase process.

Figure 9:
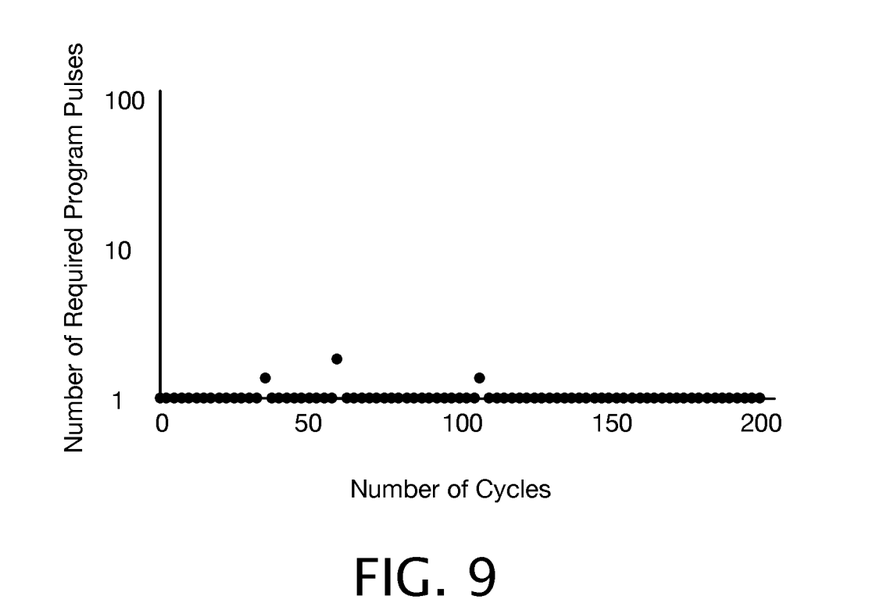
FIG. 9 is a graph showing a distribution of the number of programming pulses needed as a function of the number of programming cycles using the programming pulse sequence of the present invention.

FIG. 9 is a predictive plot showing the number of required programming pulses vs. the number of programming cycles for a single ReRAM memory cell and shows the effectiveness of the new scheme in program time reduction. The program time reduction is seen by a comparison of the prior art repetitive programming pulses of FIGS. 4 and 5 where each pulse has a duration of $T_{set}$ (including $T_{stress}+T_{form}+T_{soak}$) with the present invention in accordance with FIG. 7B where each programming pulse has a duration of $T_{form}+T_{soak}$. As shown in FIG. 9, using the methods of the present invention, a statistically large number of ReRAM memory cells may be successfully programmed with a single pulse following a pre-program pulse. If a large enough sample of ReRAM cells is included in the population represented in FIG. 9, eventually an outlier cell that does not program on the first programming cycle will appear. Additional programming pulses may be provided to account for the occasional ReRAM memory cell that does not adequately program during the first programming pulse. Using prior-art programming methods, a single bit can consume over 100 program pulses as was shown in FIG. 6. FIG. 6 further demonstrates that the required number of program pulses can vary as a function of accumulated program/erase cycles, sometimes requiring over 100 pulses.

Figure 10:
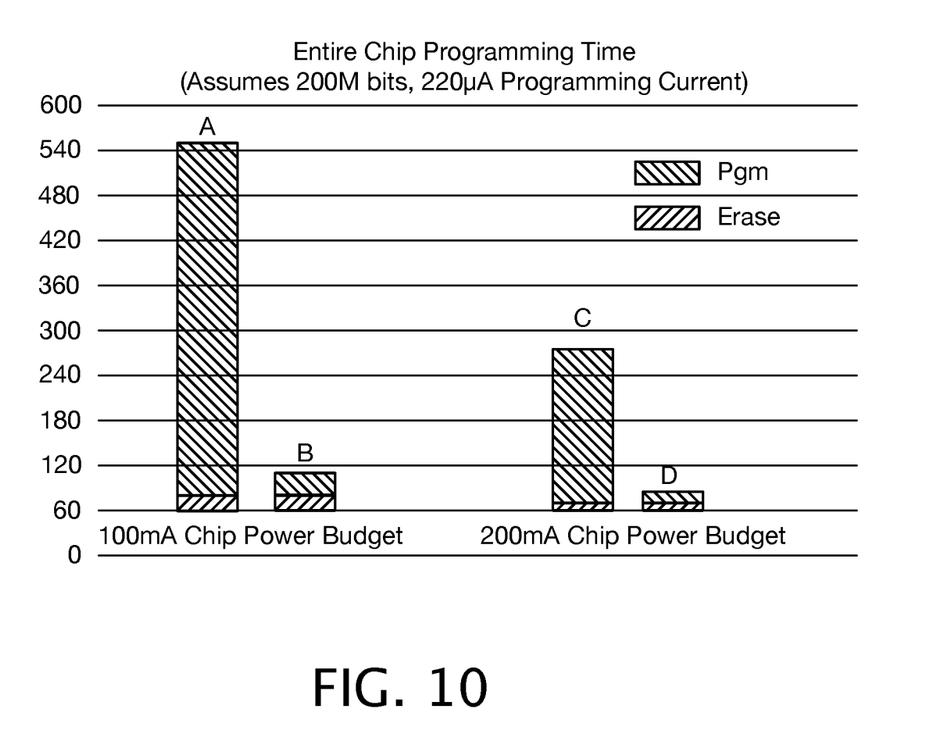
FIG. 10 is a bar graph illustrating the potential time savings obtained by employing the programming methods in accordance with an aspect of the present invention.

Referring now to FIG. 10 another comparison may be made between the programming methods of the prior art and the programming methods in accordance with the present invention. FIG. 10 is a bar graph that presents a comparison of entire chip programming time for 1 giga bit array being programmed with the y-axis reflecting time.

Two cases are depicted in FIG. 10. On the left, two bars (A and B) represent a first case of entire chip programming times for an integrated circuit having a 100 mA chip power budget. Bar A represents prior-art programming time and Bar B represents the programming time for the programming process in accordance with the present invention. On the right, two bars (C and D) represent a second case of entire chip programming times for an integrated circuit having a 200 mA chip power budget. Bar C represents prior-art programming time and Bar D represents the programming time for the programming process in accordance with the present invention. The times depicted in FIG. 10 do not include read verify time.

In the second case representing an integrated circuit having double the power budget of the first case (200 mA vs. 100 mA) the availability of twice the programming current means that twice as many ReRAM cells may be simultaneously pre-programmed using the present invention and that twice as many ReRAM cells may be simultaneously programmed using the two-stage programming process of the present invention when compared to the prior art From FIG. 10 it may be seen that using the programming methods in accordance with the present invention, the entire-chip programming time is much less than the prior-art entire-chip programming time.

By using the lower current limited pre-program pulse in accordance with the present invention, the filament starts to form in the ReRAM device right after the higher programming pulse is applied, in most cases. Since $T_{form}$ is a very short time period, the soaking time $T_{soak}$ is almost equal to the entire programming pulse width.

Figure 11:
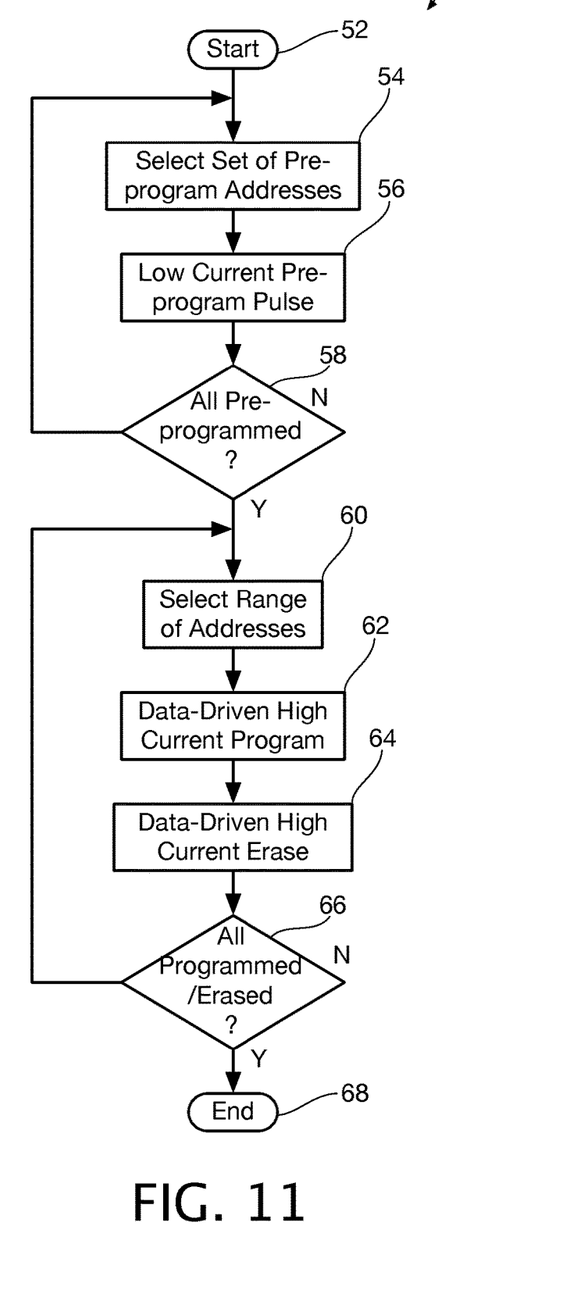
FIG. 11 is a flow diagram showing an illustrative programming method in accordance with an aspect of the present invention.

Referring now to FIG. 11, a flow chart shows an illustrative method 50 in accordance with the present invention. Method 50 may be performed by memory controller 32. In the embodiment depicted in FIG. 11, the pre-programming is applied to all of the ReRAM cells on the chip prior to starting a regular programming process. The method starts at reference numeral 52.

The pre-program stage is performed on a number of bits in parallel. The number of ReRAM cells to be simultaneously pre-programmed can be as many as the power budget allows and can be over 1 million. At reference numeral 54 a set of addresses of ReRAM memory cells to be pre-programmed is selected. The memory controller 54 of FIG. 3 directs the bit line decoder 34 and word line decoder 36 to address the selected cells. At reference numeral 56 a low-current-limited pre-programming pulse is applied to the selected ReRAM cells.

At reference numeral 58 it is determined whether all of the ReRAM cells in the array have been pre-programmed. If not, the method returns to reference numeral 54 where another set of addresses of ReRAM memory cells to be pre-programmed is selected. If all of the ReRAM memory cells have been pre-programmed, the method proceeds to reference numeral 60 where a range of addresses of ReRAM memory cells to be programmed or erased is selected. For the programming stage, the number of ReRAM memory cells that may be simultaneously programmed or erased is significantly lower than the number of ReRAM memory cells to be simultaneously pre-programmed since programming and/or erasing requires much higher current per cell than pre-programming.

The memory controller 32 of FIG. 3 directs the bit line decoder 34 and word line decoder 36 to address the selected cells. At reference numeral 62 the memory controller 52 controls the bit line decoder 34 and word line decoder 36 to drive the word lines to apply a high-current-limited programming pulse to ones of the selected ReRAM cells that are to be programmed. At reference numeral 64 the memory controller 32 controls the bit line decoder 34 and word line decoder 36 to apply a high-current erase pulse to ones of the selected ReRAM cells that are to be erased.

At reference numeral 66 it is determined whether all of the ReRAM cells in the array have been programmed or erased. If not, the method returns to reference numeral 60 where another set of addresses of ReRAM memory cells to be programmed or erased is selected. If all of the ReRAM memory cells in the array have been programmed or erased, the method proceeds to reference numeral 68 where the method ends.

Figure 12:
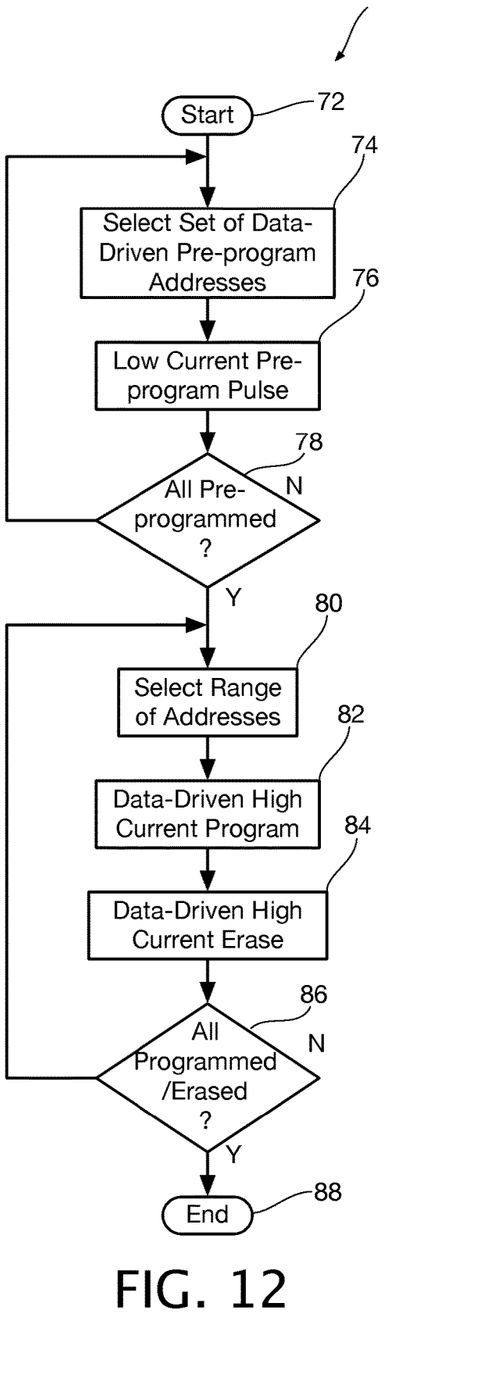
FIG. 12 is a flow diagram showing another illustrative programming method in accordance with an aspect of the present invention.

Referring now to FIG. 12, a flow chart shows another illustrative method 70 in accordance with the present invention. Method 70 may be performed by memory controller 32. Unlike the method 50 of FIG. 11, which, to save a decision step, pre-programs all of the ReRAM cells at reference numerals 54 and 56 regardless of whether they are to be programmed or erased, in the embodiment depicted in FIG. 12, the pre-programming is data driven and is applied only to the ReRAM cells on the chip that are to be programmed or erased prior to starting a regular programming process. The method starts at reference numeral 72.

As in the embodiment of FIG. 11, pre-programming is performed on a number of bits in parallel and the number of ReRAM cells to be simultaneously pre-programmed can be as many as the power budget allows and can be over 1 million. At reference numeral 74 a set of addresses of ReRAM memory cells to be pre-programmed is selected. This is a data-driven procedure that only selects ReRAM cells that are to be programmed and ignores ReRAM memory cells that are to be erased. The memory controller 32 of FIG. 3 directs the bit line decoder 34 and word line decoder 36 to address the selected ReRAM memory cells. At reference numeral 76 a low-current pre-programming pulse is applied to the selected ReRAM cells.

At reference numeral 78 it is determined whether all of the ReRAM cells in the array that are designated to be programmed have been pre-programmed. If not, the method returns to reference numeral 74 where another set of addresses of ReRAM memory cells to be pre-programmed is selected. If all of the ReRAM memory cells have been pre-programmed, the method proceeds to reference numeral 80 where a range of addresses of ReRAM memory cells to be programmed or erased is selected. For the process of programming, the number of ReRAM memory cells to be simultaneously programmed or erased is significantly lower than the number of ReRAM memory cells to be simultaneously pre-programmed since programming and erasing requires much higher current per cell than pre-programming Thus, the ReRAM memory cells to be simultaneously programmed or erased is a subset of the simultaneously pre-programmed ReRAM memory cells.

The memory controller 32 of FIG. 3 directs the bit line decoder 34 and word line decoder 36 to address the selected cells. At reference numeral 82 the memory controller 32 controls the bit line decoder 34 and word line decoder 36 to apply a high-current programming pulse only to ones of the selected ReRAM cells that are to be programmed. At reference numeral 84 the memory controller 32 controls the bit line decoder 34 and word line decoder 36 to apply a high-current erase pulse only to ones of the selected ReRAM cells that are to be erased.

At reference numeral 86 it is determined whether all of the ReRAM cells in the array have been programmed or erased. If not, the method returns to reference numeral 80 where another set of addresses of ReRAM memory cells to be programmed or erased is selected. If all of the ReRAM memory cells in the array have been programmed or erased, the method proceeds to reference numeral 88 where the method ends.

The method illustrated in FIG. 12 consumes less pre-programming time than does the method shown in FIG. 11. This is because the pre-programming process of reference numeral 76 is not applied to ReRAM memory cells that are to be erased.

Figure 13:
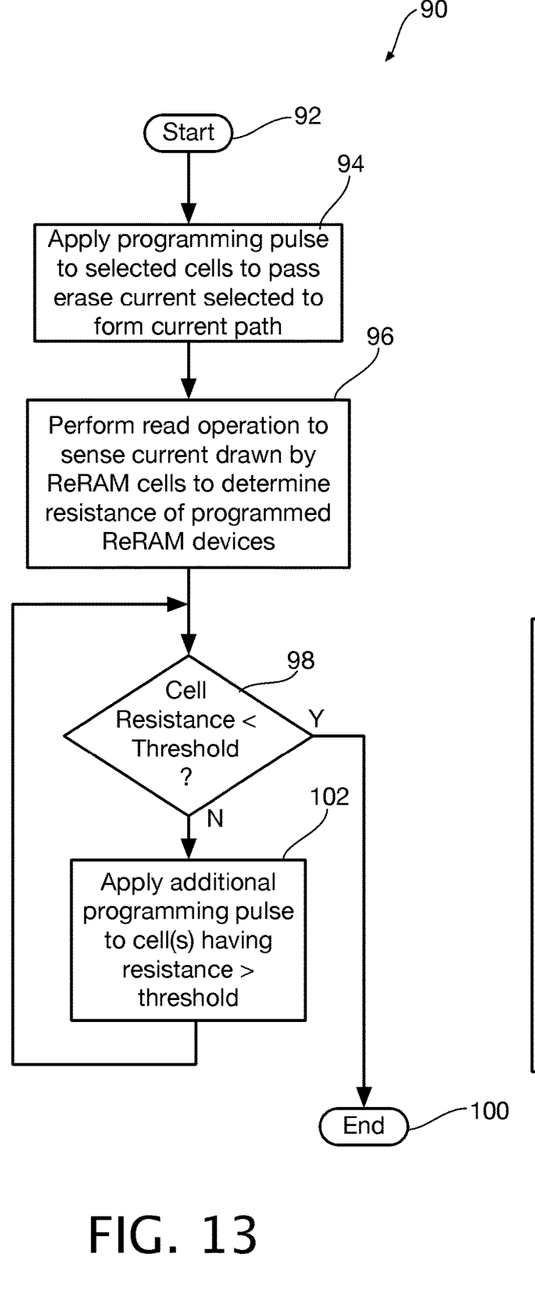
FIGS. 13 and 14 are flow diagrams showing in more detail the performance of certain processes of FIGS. 11 and 12.

Referring now to FIG. 13, a flow chart shows a method 90 that depicts in more detail the performance of the processes shown at reference numeral 62 in FIG. 11 and reference numeral 82 in FIG. 12 in accordance with an aspect of the present invention. The method begins at reference numeral 92.

At reference numeral 94 a programming pulse is applied to selected cells, and the select transistors are set to pass a programming current selected to form current path through the ReRAM device in the selected cells, i.e. the select transistors are set to provide a high current limit. At reference numeral 96 a read operation is performed to sense current drawn by the ReRAM cells to determine the resistance of the programmed ReRAM devices in the ReRAM memory cells.

At reference numeral 98 the determined resistance is compared with a predetermined threshold. If the determined resistance of all of the ReRAM memory cells being programmed is less than the predetermined threshold amount, the method proceeds to reference numeral 100 where the method ends. If the determined resistance of one or more of the ReRAM memory cells being programmed is not less than the predetermined threshold amount, the method proceeds to reference numeral 102 where an additional programming pulse is applied to the ones of the ReRAM memory cells being programmed whose determined resistance was not below the predetermined threshold. For each of these memory cells the method loops through reference numerals 98 and 102 until their determined resistance is less than the predetermined threshold amount and the method ends at reference numeral 100. Those skilled in the art will recognize that determining the resistance and comparing the resistance with the predetermined threshold may be performed as a single comparison step without exceeding the scope. Impedance may be used in place of resistance without exceeding the scope.

Figure 14:
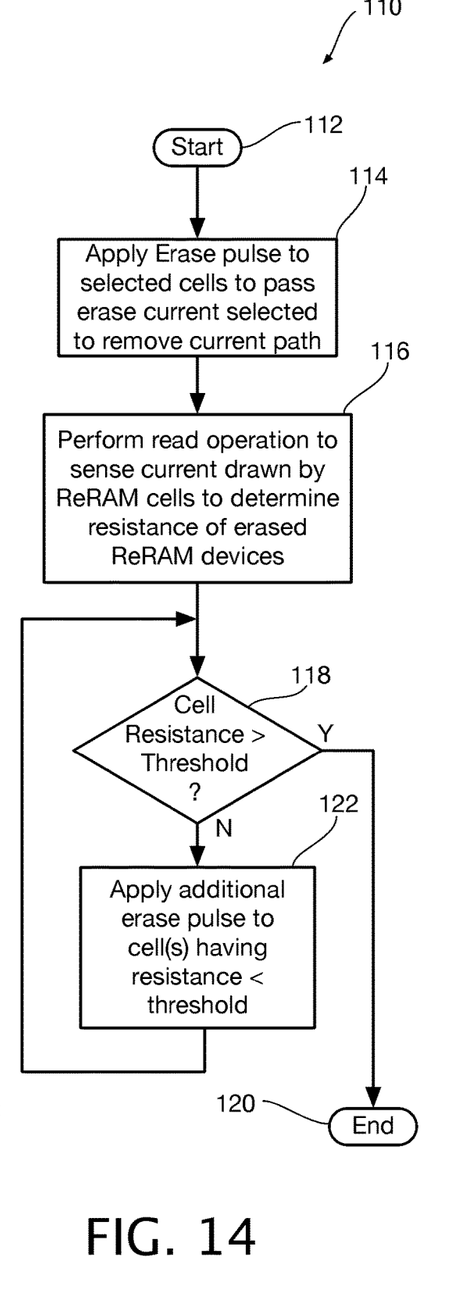

Referring now to FIG. 14, a flow chart shows a method 110 that depicts in more detail the performance of the processes shown at reference numeral 64 in FIG. 11 and reference numeral 84 in FIG. 12 in accordance with an aspect of the present invention. The method begins at reference numeral 112.

At reference numeral 114 an erase pulse is applied to selected cells to pass erase current selected to remove the current path through the ReRAM device in the selected cells. At reference numeral 116 a read operation is performed to sense current drawn by the ReRAM cells to determine the resistance of the erased ReRAM devices in the ReRAM memory cells.

At reference numeral 118 the determined resistance is compared with a predetermined threshold amount. If the determined resistance for all of the cells to be erased is greater the predetermined threshold amount, the method proceeds to reference numeral 120 where the method ends. If the determined resistance of one or more of the ReRAM memory cells is not greater than the predetermined threshold amount, the method proceeds to reference numeral 122 where an additional erase pulse is applied to the ones of the ReRAM memory cells whose resistance was not above the threshold to pass erase current selected to remove the current path through the ReRAM device in the selected cells to be erased. For each of these memory cells the method loops through reference numerals 118 and 122 until their resistance is greater than the predetermined threshold amount and the method ends at reference numeral 120. Those skilled in the art will recognize that determining the resistance and comparing the resistance with the predetermined threshold may be performed as a single comparison step without exceeding the scope. Impedance may be used in place of resistance without exceeding the scope.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming a resistive random-access memory (ReRAM) cell including a ReRAM memory device, the method comprising:
    selecting a ReRAM device to be programmed, the ReRAM device including two conductive electrodes separated by layer of a solid electrolyte material, one of the two conductive electrodes serving as an ion source;
    generating a pre-programming pulse for a first period of time that passes a first current through the selected ReRAM device for the first period of time, the first current limited to a first magnitude selected to create a leakage path through the solid electrolyte layer of the selected ReRAM device, the leakage path formed from a series of one or more discontinuities in the solid electrolyte material; and
    after the first period of time has terminated, generating a programming pulse that passes a second current limited to a second magnitude greater than the first magnitude through the selected ReRAM device for a second period of time shorter than the first period of time, the second magnitude selected to create a current path through the selected ReRAM device, the current path including a conductive filament that extends at least partially along the leakage path.

2. The method of claim 1 further comprising:
    determining resistance of the selected ReRAM device after passing the second current through the selected ReRAM device for the second period of time; and
    repeating passing the second current through the selected ReRAM device only if the determined resistance of the selected ReRAM device is higher than a predetermined threshold value.

3. The method of claim 1 wherein the first period of time is in the range of from about 10 μSec to about 1 mSec and the second period of time is in the range of from about 1 μSec to about 10 μSec.

4. The method of claim 3 wherein the first period of time is about 100 μSec and the second period of time is about 1 μSec.

5. The method of claim 1 wherein the first magnitude is between about 1 µA and about 100 µA.

6. The method of claim 1 wherein the second magnitude is between about 100 µA and about 1 mA.

7. A method for programming a resistive random-access memory (ReRAM) cell including a ReRAM device and at least one select transistor connected in series between a bit line and a source line, the ReRAM device including two conductive electrodes separated by layer of a solid electrolyte material, one of the two conductive electrodes serving as an ion source, the at least one select transistor having a gate connected to a word line, the method comprising:
  applying a programming potential between the bit line and the source line;
  applying a pre-programming voltage pulse to the word line, the pre-programming voltage pulse turning on the at least one select transistor to cause a pre-programming current limited to a first magnitude to flow through the ReRAM device, the first magnitude selected to create a leakage path through the solid electrolyte layer, the leakage path formed from a series of one or more discontinuities in the solid electrolyte material;
  applying a programming voltage pulse to the word line after applying the pre-programming voltage pulse to the word line, the programming voltage pulse having a magnitude higher than the pre-programming voltage pulse, the programming voltage pulse turning on the at least one select transistor to cause a programming current limited to a second magnitude higher than the first magnitude to flow through the ReRAM device, the second magnitude selected to create a current path having a desired resistance across the ReRAM cell, the current path including a conductive filament that extends at least partially along the leakage path; and
  wherein the pre-programming voltage pulse has a width larger than the programming voltage pulse.

8. The method of claim 7 further comprising:
  (a) determining the resistance of the ReRAM cell after the end of the programming voltage pulse;
  (b) if the determined resistance of the ReRAM cell is higher than a predetermined threshold, applying an additional programming voltage pulse to the word line and repeating step (a);
  (c) if the determined resistance of the ReRAM cell is no higher than the predetermined threshold, terminating the method.

9. The method of claim 7 wherein the pre-programming voltage pulse has a width in the range of from about 10 µSec to about 1 mSec and the programming voltage pulse has a width in the range of from about 1 µSec to about 10 µSec.

10. The method of claim 7 wherein the pre-programming voltage pulse has a width of about 100 µSec and the programming voltage pulse has a width of about 1 µSec.

11. The method of claim 7 wherein the first magnitude is between about 1 µA and about 100 µA.

12. The method of claim 7 wherein the second magnitude is between about 100 µA and about 1 mA.

13. In an array of resistive random-access memory (ReRAM) memory cells each including a ReRAM device having two conductive electrodes separated by layer of a solid electrolyte material, one of the two conductive electrodes serving as an ion source, a method for programming comprising:
  simultaneously passing a first pre-programming current through the ReRAM device in each of a selected first plurality of ReRAM memory cells for a first period of time, some of the ReRAM cells in the selected first plurality of ReRAM memory cells to be programmed in a subsequent programming step and others of the ReRAM cells in the selected first plurality of ReRAM cells not to be programmed in a subsequent programming step, the first pre-programming current limited to a first magnitude selected to create a leakage path through the solid electrolyte layer of each ReRAM device in the selected first plurality of ReRAM memory cells, the leakage path formed from a series of one or more discontinuities in the solid electrolyte material;
  selecting a second plurality of ReRAM memory cells, the second plurality being a subset of the first plurality of ReRAM memory cells and including only those ones of the first plurality of cells that are to be programmed in the subsequent programming step; and
  after passing the first pre-programming current through the ReRAM device in each of the selected first plurality of ReRAM memory cells, performing the subsequent programming step by simultaneously passing a programming current through the ReRAM device in each of the second plurality of ReRAM memory cells for a second period of time shorter than the first period of time, the programming current limited to a second magnitude greater than the first magnitude, the second magnitude selected to create a current path having a desired resistance across the ReRAM cell, the current path including a conductive filament that extends at least partially along the leakage path.

14. The method of claim 13, wherein the second magnitude is selected to create a current path through the ReRAM device in each of the selected first plurality of ReRAM memory cells.

15. The method of claim 13 wherein selecting at least one ReRAM memory cell comprises applying a programming potential between a bit line connected to the at least one ReRAM memory cell and a source line connected to the at least one ReRAM memory cell.

16. The method of claim 13 wherein:
  the simultaneous passing of the pre-programming current through the ReRAM device in each of the selected first plurality of ReRAM memory cells for the first period of time comprises turning on at least one select transistor connected in series with each ReRAM device by applying a first gate potential to the at least one select transistor, the applied first gate potential limiting the pre-programming current to the first magnitude; and
  the simultaneous passing of the programming current through the ReRAM device in each of the second plurality of ReRAM memory cells for the second period of time comprises turning on the at least one select transistor by applying a second gate potential to the at least one select transistor, the second gate potential being larger than the first gate potential and limiting the programming current to the second magnitude.

17. The method of claim 13 wherein the first period of time is in the range of from about 10 µSec to about 1 mSec and the second period of time is in the range of from about 1 µSec to about 10 µSec.

18. The method of claim 13 wherein the first period of time is about 100 µSec and the second period of time is about 1 µSec.

19. The method of claim 13 wherein the first magnitude is between about 1 µA and about 100 µA.

20. The method of claim 13 wherein the second magnitude is between about 100 µA and about 1 mA.

21. In an array containing rows and columns of ReRAM memory cells, each column of memory cells including ReRAM memory cells formed from a ReRAM device in series with at least one select transistor between a column bit line and a column source line, each row of memory cells including a word line coupled to the gate of the at least one select transistor, a programming circuit comprising:
- a bit line decoder coupled to each of the bit lines in the array;
- a word line decoder coupled to each of the word lines in the array;
- a source line driver coupled to common source line in the array;
- a memory controller coupled to the bit line decoder, the word line decoder, and the source line driver, the memory controller configured to address ReRAM cells in the array and to program selected ReRAM cells in the array by controlling the bit line decoder, the word line decoder and the source line driver to pass a pre-programming current through selected ReRAM devices in each of a selected first plurality of ReRAM memory cells for a first period of time, some of the ReRAM cells in the selected first plurality of ReRAM memory cells to be programmed in a subsequent programming step and others of the ReRAM cells in the selected first plurality of ReRAM cells not to be programmed in a subsequent programming step, the pre-programming current limited to a magnitude selected to create a leakage path through the solid electrolyte layer in each of the ReRAM devices of the selected first plurality of ReRAM memory cells, the leakage path formed from a series of one or more discontinuities in the solid electrolyte material,
- the memory controller configured to select a second plurality of ReRAM memory cells, the second plurality being a subset of the first plurality of ReRAM memory cells and including only those ones of the first plurality of cells that are to be programmed in the subsequent programming step, and after passing the pre-programming current through the selected ReRAM devices performing the subsequent programming step by passing a programming current through the selected second plurality of ReRAM devices for a second period of time shorter than the first period of time, the programming current limited to a magnitude selected to create a current path through the selected-second plurality of ReRAM devices, the current path including a conductive filament that extends at least partially along the leakage path.

22. The programming circuit of claim 21 wherein the memory controller is further configured to erase the selected ReRAM cells in the array by controlling the bit line decoder, the word line decoder and the source line driver to pass an erase current in a direction opposite the first and second currents through the selected ReRAM devices, the erase current limited to a magnitude selected to remove the current path through the selected ReRAM devices.

23. The programming circuit of claim 21 wherein the memory controller is further configured to control the common source driver to apply ground potential to the common source line during programming and reading and to apply an erase potential to the common source line during erasing.

* * * * *